United States Patent
Najafi et al.

(10) Patent No.: US 10,524,059 B2
(45) Date of Patent: Dec. 31, 2019

(54) CAPACITIVE-BASED TRANSDUCER WITH HIGH ASPECT RATIO

(71) Applicant: THE REGENTS OF THE UNIVERSITY OF MICHIGAN, Ann Arbor, MI (US)

(72) Inventors: Khalil Najafi, Ann Arbor, MI (US); Yemin Tang, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 132 days.

(21) Appl. No.: 15/740,986

(22) PCT Filed: Jul. 1, 2016

(86) PCT No.: PCT/US2016/040781
§ 371 (c)(1),
(2) Date: Dec. 29, 2017

(87) PCT Pub. No.: WO2017/030666
PCT Pub. Date: Feb. 23, 2017

(65) Prior Publication Data
US 2018/0359570 A1    Dec. 13, 2018

Related U.S. Application Data

(60) Provisional application No. 62/188,168, filed on Jul. 2, 2015.

(51) Int. Cl.
*H04R 19/00*  (2006.01)
*H04R 17/02*  (2006.01)
(Continued)

(52) U.S. Cl.
CPC ....... *H04R 19/005* (2013.01); *B81C 1/00269* (2013.01); *H04R 17/02* (2013.01);
(Continued)

(58) Field of Classification Search
None
See application file for complete search history.

(56) References Cited

U.S. PATENT DOCUMENTS 8,705,159 B2    4/2014  Lee
2003/0197448 A1  10/2003  Tanielian
(Continued)

FOREIGN PATENT DOCUMENTS

JP       H09054114 A    2/1997

OTHER PUBLICATIONS

International Search Report and Written Opinion for PCT/US2016/040781, dated Apr. 18, 2017; ISA/KR.

*Primary Examiner* — Bradley Smith
(74) *Attorney, Agent, or Firm* — Harness, Dickey & Pierce, P.L.C.

(57) ABSTRACT

Techniques are presented for fabricating transducers and other types of microstructures having high aspect ratios. To achieve high aspect ratios, wafers are etched from both sides for example using deep reactive ion etching. The three-dimensional structure is designed to have an overall footprint less than four hundred micrometers with a thickness on the order of 0.5-2 millimeters as compared to conventional planar devices.

10 Claims, 16 Drawing Sheets

(51) Int. Cl.
*H04R 19/04* (2006.01)
*B81C 1/00* (2006.01)
*H04R 31/00* (2006.01)
*H04R 17/00* (2006.01)

(52) U.S. Cl.
CPC ............ *H04R 19/00* (2013.01); *H04R 19/04* (2013.01); *H04R 31/00* (2013.01); *H04R 17/00* (2013.01); *H04R 2201/003* (2013.01)

(56) References Cited

U.S. PATENT DOCUMENTS

| | | |
|---|---|---|
| 2009/0152654 A1 | 6/2009 | Classen et al. |
| 2010/0193884 A1 | 8/2010 | Park et al. |
| 2013/0205921 A1* | 8/2013 | Venter ................. G01N 1/02 73/864 |
| 2014/0239768 A1* | 8/2014 | Johnson ............... B06B 1/0292 310/300 |
| 2015/0137285 A1* | 5/2015 | Shim ..................... B81B 7/007 257/416 |
| 2018/0180724 A1* | 6/2018 | Zhang .................... G01S 7/521 |

* cited by examiner

Gap Profile

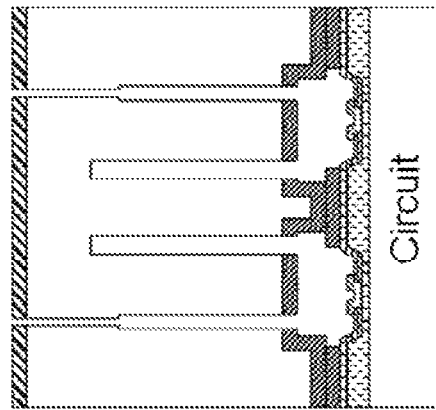
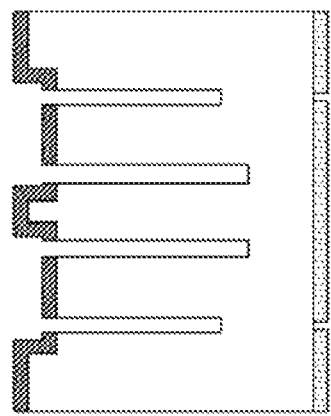
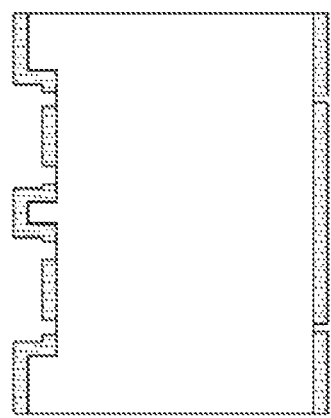
FIG. 7A  FIG. 7B  FIG. 7C  FIG. 7D  FIG. 7E  FIG. 7F

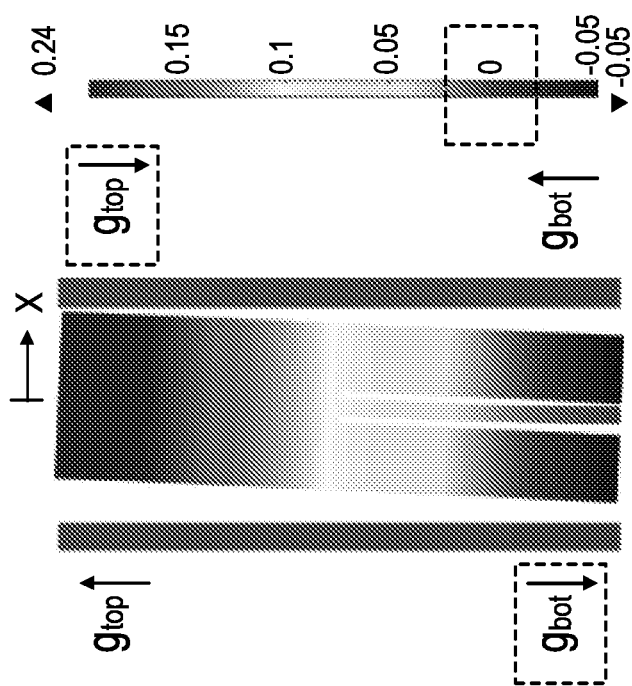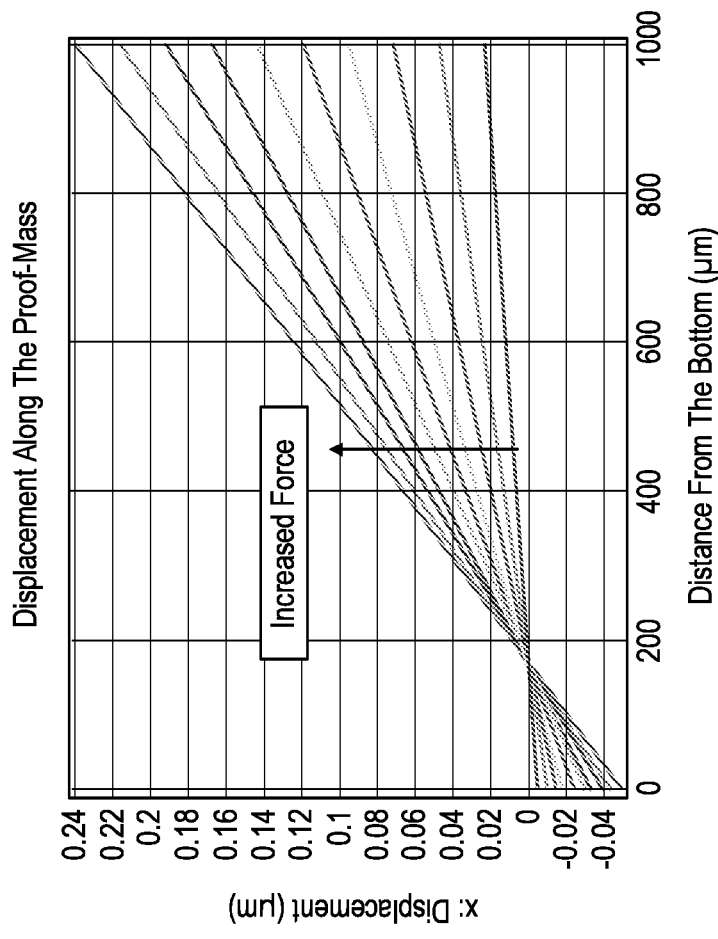
FIG. 9B

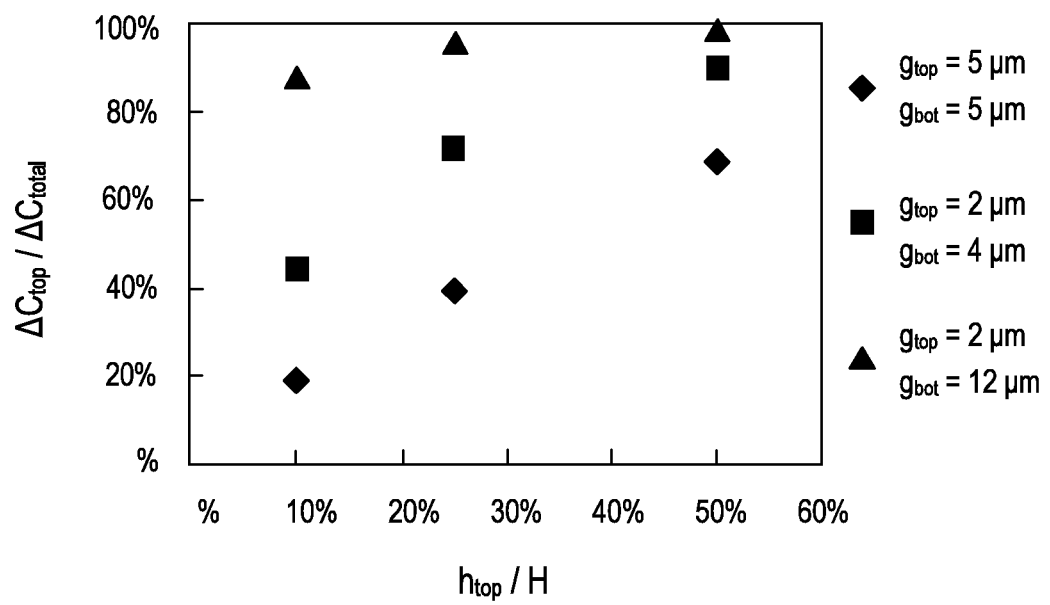
FIG. 10
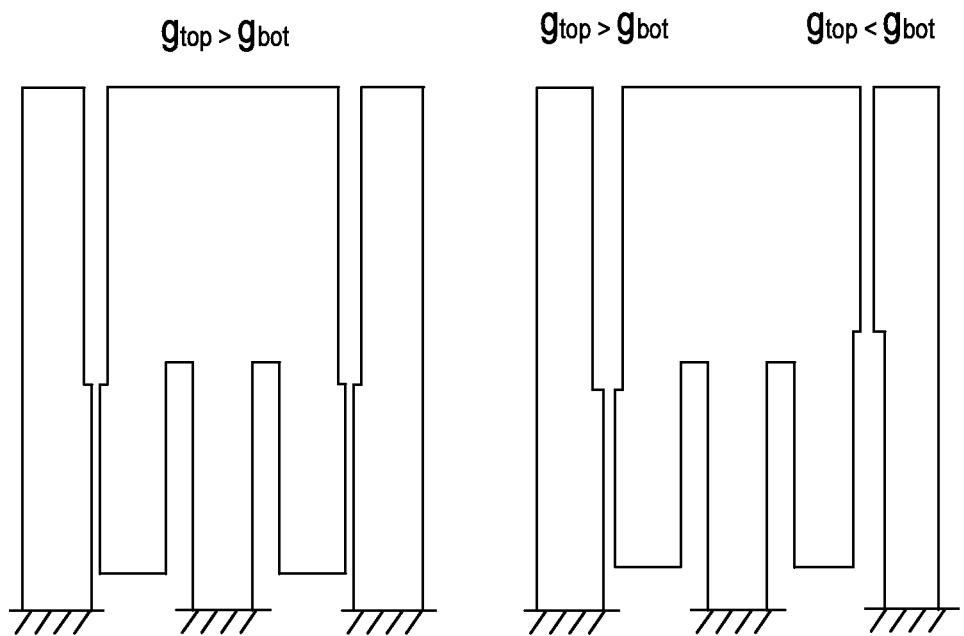
FIG. 11A  FIG. 11B

CAPACITIVE-BASED TRANSDUCER WITH HIGH ASPECT RATIO

CROSS-REFERENCE TO RELATED APPLICATIONS

This application is a U.S. National Phase Application under 35 U.S.C. 371 of International Application No. PCT/US2016/040781 filed on Jul. 1, 2016 and published as WO 2017/030666 A2 on Feb. 23, 2017. This application claims the benefit of U.S. Provisional Application No. 62/188,168, filed on Jul. 2, 2015. The entire disclosures of the above applications are incorporated herein by reference.

GOVERNMENT CLAUSE

This invention was made with government support under W911NF-08-2-0004 awarded by Army/ARO. The Government has certain rights in the invention.

FIELD

The present disclosure relates to techniques for fabricating transducers and other types of microstructures having small footprints with high aspect ratios.

BACKGROUND

Bulk micromachined capacitive type transducers can provide larger mass and larger transduction area compared to surface micromachined devices. However, higher sensitivity or efficient tuning and feedback by electrostatic force is limited due to the difficulty in fabricating high aspect-ratio (HAR) vertical capacitive sensing/actuation gaps. To achieve minimum gap, device height has to be compromised because of limitations and lag with Deep Reactive Ion Etching (DRIE) limitations and lag.

Researchers have developed several fabrication methods for making small capacitive transduction gaps for MEMS devices. Although the width and aspect-ratio of the gaps are impressive, the device height is still limited by the gap height. For effective gaps of several micrometers, the gap height is typically less than 150 µm. High aspect-ratio sub-micrometer gaps are achievable for gap height at a few tens of micrometers, while other sub-micrometer or sub-100 nm gaps are only found in thin (several micrometers) RF resonators that are surface micromachined.

Among these methods, sacrificial material is most frequently chosen to precisely define high aspect ratio gaps at 1-2 µm or sub-micrometer range. Timing in gas or liquid phase release etching is sensitive and limits the proceeding or subsequent process steps. In addition, the processes result in larger total chip area than the active device in order to ensure structural integrity. Other fabrication processes combine two-sided surface micromachining, bulk micromachining and sacrificial oxide patterning. Full wafer thickness is achieved with the 1.5 µm sensing gap and thickness of 70 µm. Silicon dioxide is used as sacrificial layer and the device is released in HF after anisotropic wet etching of the SCS proof-mass in EDP. Another example is the sub-micrometer gap SCS resonators/accelerometers/gyroscopes made by HARPSS or HARPSS-SOI process where sacrificial oxide is also used to define the gap dimensions. The effective thickness is bonded in the range of 30-150 µm with corresponding gap dimensions definable in the range of 0.1-2 µm. Timing in gas or liquid phase release etching limits the maximum thickness achieved for a minimum gap dimension. Although the device thickness may be increased by back-side processing of the substrate silicon in silicon on insulator wafers, effective sensing/actuation areas are limited to few tens of micrometers because of the device layer thickness and back-filling limitations.

Work has also been done toward the possibility of enhancing the etching properties of photo-assisted electrochemical etching in hydrofluoric acid to create HAR gaps and to replace deep reactive ion etching. Sub-200 nm gaps with ultra HAR of 125:1 have been demonstrated but the height is limited to less than 25 um. Most literature to date only tested uniformly patterned bars, circles or rectangles. Factors including composition of electrolyte, applied bias and photo-intensity of the light source combined affect the etching profile, repeatability and reproducibility.

These existing methods are complicated and not applicable to or optimal for 3-D, small-footprint, thick devices. Wet processing also limits the process window for integrating with other parts of MEMS structure and potential integration with CMOS circuits. Therefore, it is desirable to develop transducers and other types of microstructures having small footprints with high aspect ratios.

This section provides background information related to the present disclosure which is not necessarily prior art.

SUMMARY

This section provides a general summary of the disclosure, and is not a comprehensive disclosure of its full scope or all of its features.

A method is presented for fabricating a transducer with a high aspect ratio. The method includes: forming a bottom trench in a bottom surface of a first substrate; mounting the first substrate onto a top surface of a second substrate, such that the bottom surface of the first substrate is disposed on the top surface of the second substrate; bonding the first substrate to the second substrate; and forming a top trench into a top surface of the first substrate, such that the top trench aligns with the bottom trench and has a depth that interconnects the top trench with the bottom trench to thereby form to a channel. The channel surrounds and defines a transducer structure in the first substrate.

In one embodiment, the transducer structure is defined as a beam extending upwardly from the top surface of the second substrate. In other embodiments, a mass is attached to the beam.

In one embodiment, the top trench is formed with same width as the bottom trench; whereas, in other embodiments, the top trench is formed with a different width than the bottom trench. For example, the top trench is formed with a smaller width than the bottom trench or the top trench is formed with a larger width than the bottom trench. In some embodiments, the top trench or bottom trench includes sections with different widths.

In an example implementation the fabrication method is further defined as follows. The method begins by forming an inner trench into a bottom surface of a first substrate, whereby the inner trench defines and surrounds a cantilever beam for a transducer structure; and forming an outer trench into the bottom surface of the first substrate, wherein the outer trench surrounds the inner trench. A detection circuit may also be formed a top surface of a second substrate. The first substrate is mounted onto the top surface of the second substrate, such that the bottom surface of the first substrate is supported by the top surface of the second substrate, and then bonded to the second substrate to form a transducer structure. Lastly, a third trench is formed into a top surface of the first substrate, such that the third trench aligns with the second trench and the third trench has a depth that interconnects the third trench with the second trench to form a channel surrounding the transducer structure, whereby sidewalls of the channel serve as capacitive plates.

In some embodiments, the third trench is etched with a smaller width than the second trench. In other embodiments, the third trench is etched with a larger width than the second trench. The first trench and the second trench can be formed concurrently using deep reactive ion etching.

Prior to the step of bonding, a metal layer is formed on the bottom surface of the first substrate to serve as a bonding inter-layer and prevent oxidization. Forming the detection circuit may further include depositing an oxide layer onto the second substrate, forming recesses into the oxide layer, and depositing metal onto the oxide layer to form bonding pads and electrical interconnections.

In one aspect of the disclosure, a transducer having a high aspect ratio is achieved. The transducer includes a base substrate; a transducer structure and one or more electrodes. The transducer structure is mounted on a top surface of the substrate and extends upwardly from the top surface of the substrate. The transducer structure is comprised of a cantilever beam. The electrodes are also mounted on the top surface of the substrate and extending upwardly from the top surface of the substrate. The electrodes are disposed adjacent to the transducer structure with a channel extending entire height of the transducer structure and separating the one or more electrodes from the transducer structure, such that width of the channel proximate to top of the transducer structure differs from width of the channel proximate to bottom of the transducer structure.

In some embodiments, the width of the channel proximate to top of the transducer structure is smaller than the width of the channel proximate to bottom of the transducer structure; whereas, in other embodiments, the width of the channel proximate to top of the transducer structure is larger than the width of the channel proximate to bottom of the transducer structure.

In some embodiments, the channel has two or more sections extending around the transducer structure, such that, in a first section of the channel, the width of the channel proximate to top of the transducer structure is smaller than the width of the channel proximate to bottom of the transducer structure; and in a second section, the width of the channel proximate to top of the transducer structure is larger than the width of the channel proximate to bottom of the transducer structure.

The transducer structure may further include a mass attached to the cantilever beam, where the mass is coupled to the cantilever beam proximate to top of the cantilever beam. The mass may include one or more overhangs extending downward from a top of the cantilever beam and adjacent to one or more vertical surfaces of the cantilever beam, where a slot separates the one or more overhangs from the cantilever beam.

The width of the channel may be further narrowed by depositing a conductive material (e.g., metal, doped-polysilicon) or a non-conductive material (e.g., oxide) along sidewalls of the channel.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 7A-7F are diagrams depicting an example implementation of the fabrication method;

FIGS. 9A and 9B are images depicting the transducer structure under different deflection scenarios;

FIG. 10 is a chart showing relative change in capacitance of the transducer structure for different configurations;

FIGS. 11A and 11B are cross-sectional views of an example transducer with narrow gaps proximate the bottom and top, respectively;

Corresponding reference numerals indicate corresponding parts throughout the several views of the drawings.

DETAILED DESCRIPTION

Example embodiments will now be described more fully with reference to the accompanying drawings.

Figure 1B:
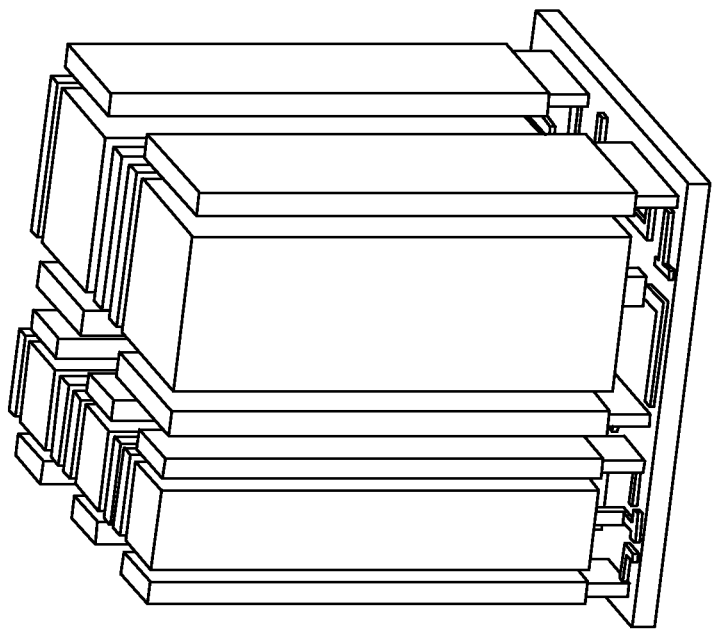
FIG. 1B is an array of transducers having high aspect ratios.
Figure 1A:
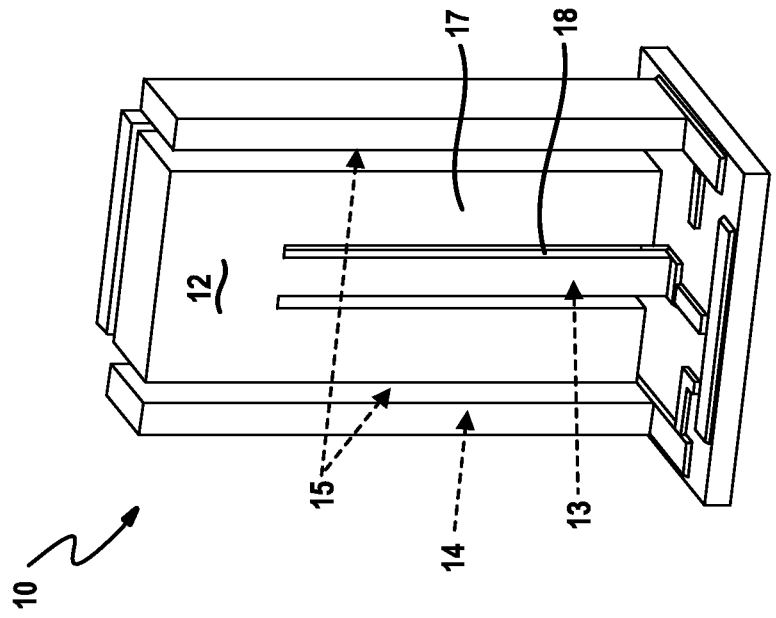
FIG. 1A is a diagram of an example transducer having a high aspect ratio.

FIG. 1A depicts an example transducer 10 with a high aspect ratio in accordance with the teachings of this disclosure. The transducer 10 is comprised of a proof-mass 12 atop a narrow beam 13 to form a transducer structure 11 and one or more electrodes 14 adjacent to the transducer structure. The beam acts as mechanical spring and the proof-mass is separated from the electrodes 14 by a gap 15 for capacitive transduction of motion. It is studied as a vertical cantilever beam fixed at the base and the design goal is to enable effective transduction. While reference is made to a transducer, it is readily understood that the concepts described here are applicable for constructing other type of MEMS devices as well.

More specifically, the transducer structure 11 is mounted on a top surface of a substrate 8 and extends upwardly from a surface of the top surface of the substrate. In this example, the transducer structure is comprised of a cantilever beam 13 integrally formed with a mass 12 that is attached to the cantilever beam 13. The mass 12 is coupled to the cantilever beam 13 proximate to top of the cantilever beam. The mass 12 includes one or more overhangs 17 extending downward from the top of the cantilever beam 13 and adjacent to one or more vertical surfaces of the cantilever beam 13, such that a slot 18 separates the overhangs 17 from the cantilever beam.

The electrodes 14 are also mounted on the top surface of the substrate and extend upwardly from a surface of the top surface of the substrate. The electrodes 14 are disposed around periphery of the transducer structure with a channel extending entire height of the transducer structure and separating the one or more electrodes from the transducer structure.

When the upward beam cross-section is square shaped, for the first bending mode, the spring-mass bends along one of the two orthogonal axes toward one of the four electrodes (x+, x−, y+, y−) when force is exerted. This structure meets the following requirements: small footprint transduction element, high performance and easily tailored structural dimensions, built in large and dense arrays with potential signal processing ability. The transduction gaps and separation trenches can be independently defined from both sides. The fabrication technology is more compatible with proceeding or subsequent processing steps so it will allow the transducer to be easily integrated with complementary metal-oxide-semiconductor (CMOS) integrated circuits (IC) fabricated in foundry.

Figure 2A:
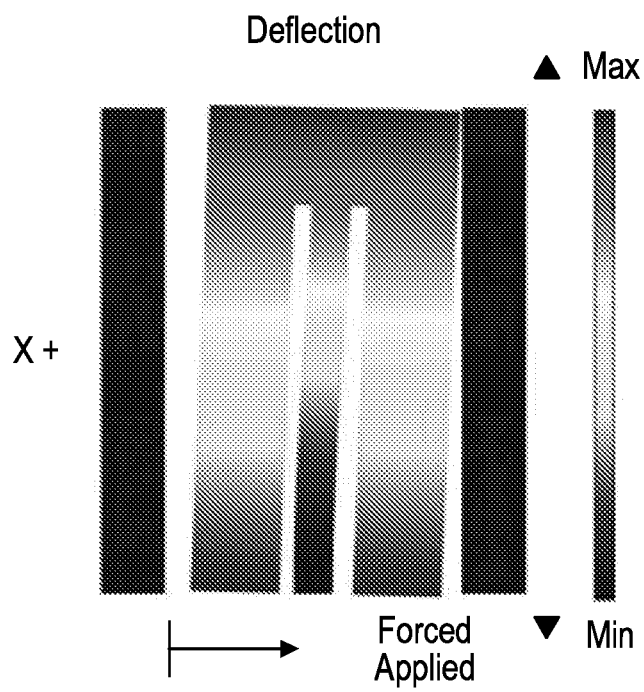
FIG. 2A is an image depicting stress during deflection of the transducer structure.
Figure 2B:
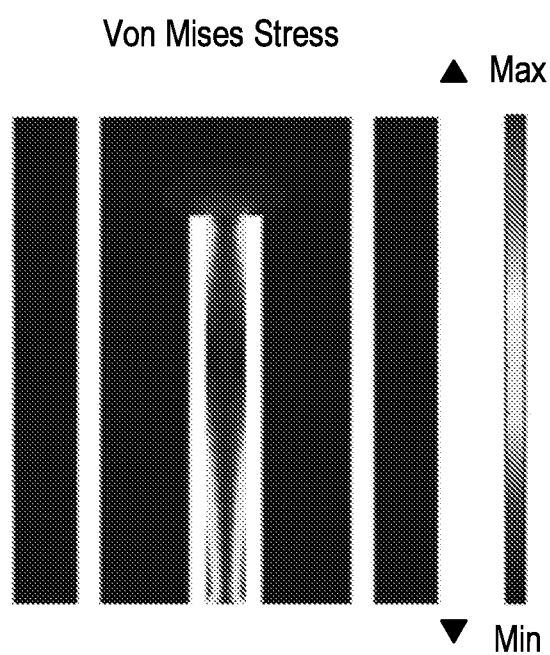
FIG. 2B is an image depicting stress experienced by the transducer structure.
Figure 2C:
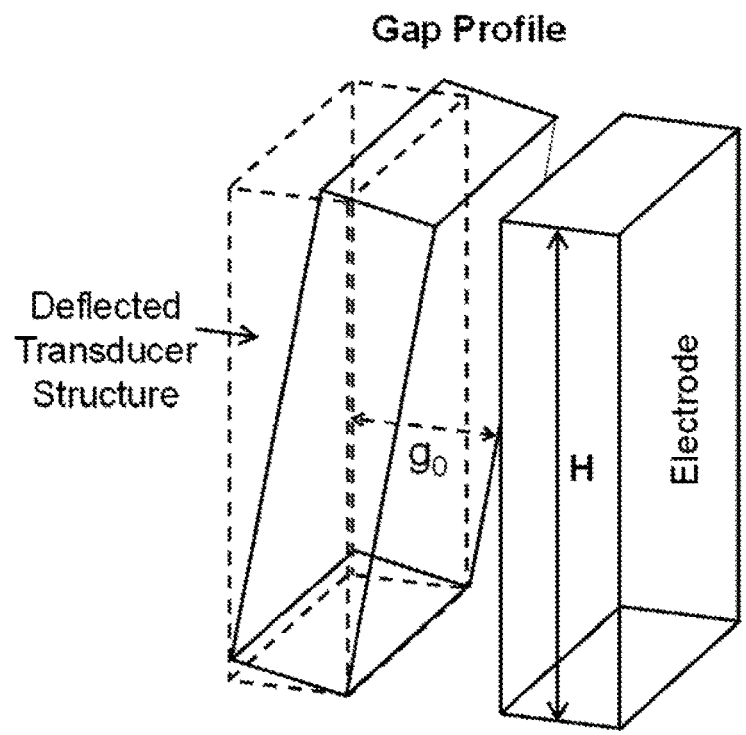
FIG. 2C is a diagram illustrating the gap profile between a deflected transducer structure and adjacent electrodes.

Assuming a device thickness of 500 µm, the transducer is simulated using COMSOL. With reference to FIG. 2A-2C, force is applied in the x direction and the deflection of the proof-mass and electrodes in the same direction is plotted. Spring length, material properties and mass center determines the displacement profile along the side of the proof-mass. Maximum stress is experienced at the base of the vertical beam as seen in FIG. 2B. For one specific case where the hair structure consists of a $300^2$ µm$^2$ footprint 500 µm tall proof-mass, $30^2 \times 400$ µm$^3$ vertical beam, the gap profile (formed by the deflected proof-mass and one of the electrodes) is a trapezoid where the top undergoes maximum deflection as shown in FIGS. 2A and 2C.

The upward spring in the middle can be made very narrow and long, thus it is very compliant and flexible. The electrodes are designed to be much less compliant than the hair-like spring such that it experiences deflection more than two orders of magnitude less than the proof-mass. Therefore, the proof-mass may be considered movable and the electrode may be considered as fixed. In the simulated embodiment, both proof-mass and electrodes are fabricated in the same highly-doped bulk silicon that has low resistance so they naturally form the conductive capacitor plates.

Figure 3:
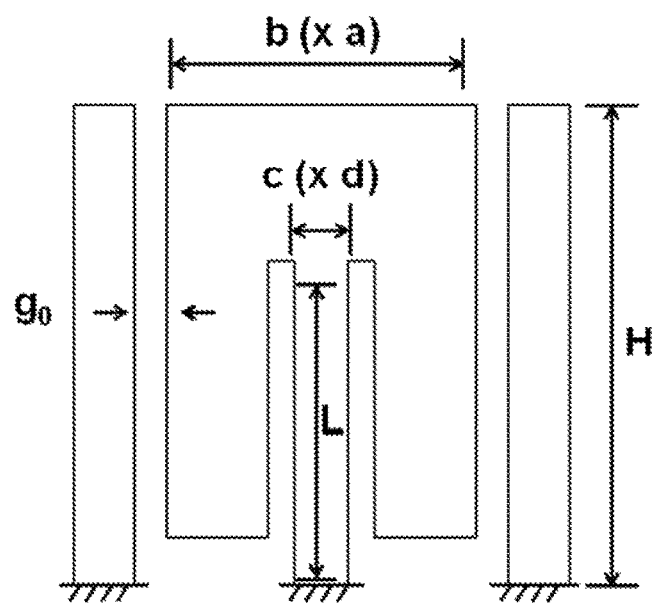
FIG. 3 is a cross-sectional view of an example transducer structure having a uniform gap size.

Critical design parameters are shown in FIG. 3. These parameters include: total device height (H), mass footprint (a×b), spring length (L), spring cross-section area (c×d), and the nominal transduction gap ($g_0$ for uniform gap and $g_{top}$ & $g_{bot}$ for two-gap approach). The displacement along the side of the proof-mass and the maximum displacement at the top of the mass are:

$$\Delta x_{mass}(z) = \Delta x(L) + \Delta x'(L)(z - L) \qquad (1)$$
$$= \frac{\text{Mass} \times \text{Accel.}}{k} \frac{1}{2L^2}[3(2h-L)z - (3h-2L)L]$$

$$\Delta x_{mass}(H) = \frac{\text{Mass} \times \text{Accel.}}{k} \frac{1}{2L^2}(12h^2 - 15Lh + 5L^2), \qquad (2)$$
$$h = \frac{L+H}{2}$$

When the proof-mass is displaced under external lateral force, the final gap dimensions at the top and at the bottom are:

$$g_{top}(H) = g_0 - \Delta x_{mass}(H), g_{bot}(0) = g_0 - \Delta x_{mass}(0) \qquad (3)$$

Thus the new capacitance reading when force is applied compared to the initial capacitance are:

$$C_1 = \varepsilon \times \text{Area} \times \frac{1}{g_{top}(H) - g_{bot}(0)} \ln\left(\frac{g_{top}(H)}{g_{bot}(0)}\right) \qquad (4)$$
$$C_0 = \varepsilon \times \text{Area} \times \frac{1}{g_0}$$

When the displacement is small, the change in capacitance can be approximated by Taylor expansion as:

$$\Delta C = C_1 - C_0 \approx \frac{1}{2}\varepsilon \times \text{Area} \times \frac{\text{Mass}}{k} \times \frac{1}{g_0^2} \times Accel. \qquad (5)$$

$$\frac{\Delta C}{Accel.} = \frac{1}{2}\varepsilon \times (a \times H) \times \frac{abH}{dc^3/L^3} \times \frac{1}{g_0^2} \qquad (6)$$

From Equation (6), one can see that the sensitivity is inversely proportional to $1/g_0^2$ and scales with the proof-mass size (a, b, H), the sensing area (a, H) and the spring dimensions (c, d, L). A taller H also allows for longer vertical spring L. Thus, device height H plays a critical role in improving the sensitivity for this design by utilizing the third dimension.

By varying the design parameters (H, L, a, b, c, d, and gap), multi-element arrays of transducers can be built with modulated dimensions. An example array of transducers with varying dimensions can be seen in FIG. 1B. While the electrodes are shown as being on all four sides of a transducer structure having shape of a rectangular cuboid, it is understood that electrodes do not need to surround the transducer structure. For example, the transducer structure may be configured with only two electrodes arranged on opposing sides of the transducer structure. In another example, the transducer structure may be configured with only one electrode adjacent to the transducer structure. Other arrangements with one or more electrodes disposed proximate to the transducer structure also fall within the scope of this disclosure.

Figure 4A:
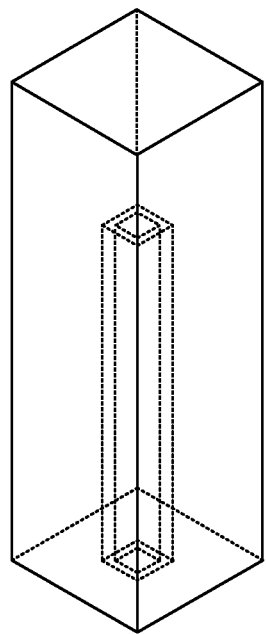
FIGS. 4A-4C are diagrams illustrating different geometric shapes for the transducer structure.
Figure 4B:
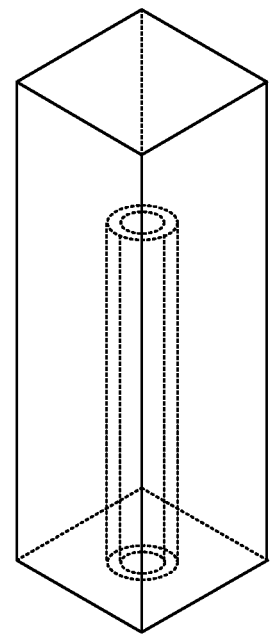
Figure 4C:
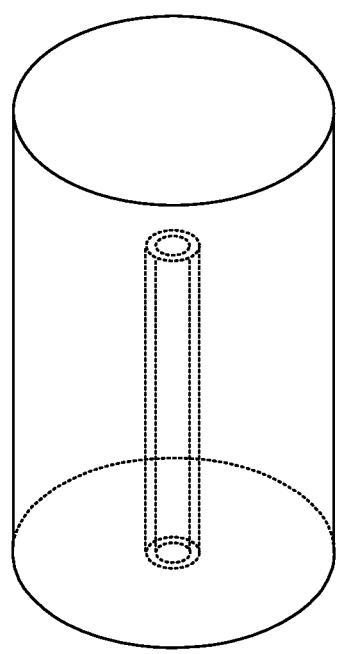

The rectangular cuboid shape for the cantilever beam 13 and the proof-mass 12 can easily be modified by varying the mask design to realize different structures. In FIG. 4A, the cantilever beam 13 and the proof-mass 12 are shown as rectangular cuboids. In FIG. 4B, the cantilever beam 13 is a cylinder and the proof-mass 12 is rectangular cuboid. In FIG. 4C, the cantilever beam and the proof-mass are shown as cylinders. Other geometries for these two components are also contemplated by this disclosure.

Figure 5A:
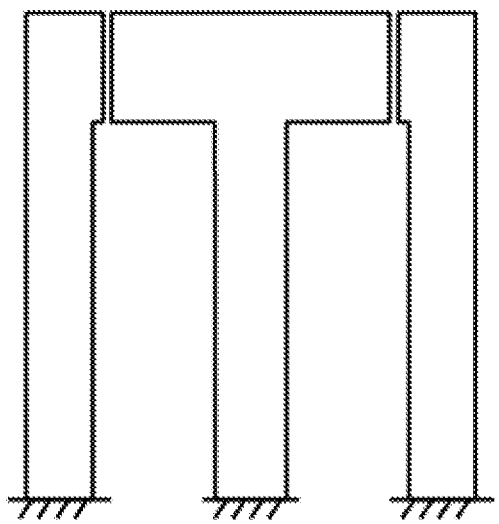
FIGS. 5A-5H are diagrams illustrating different configurations for the mass associated with the transducer structure.
Figure 5B:
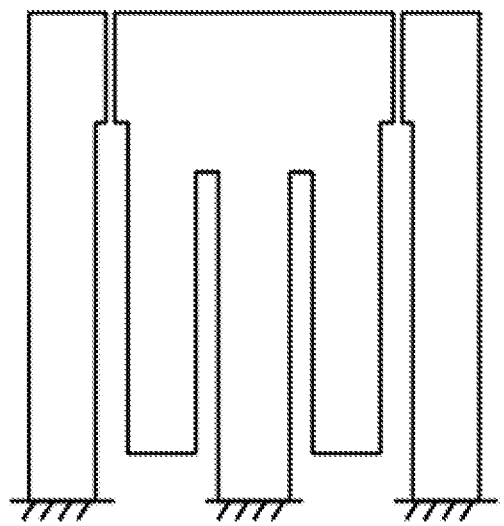
Figure 5C:
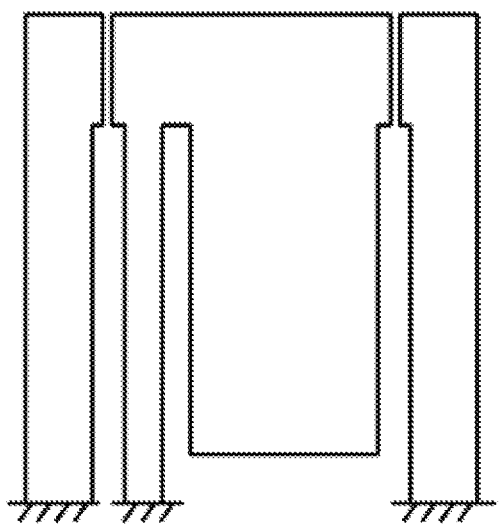
Figure 5D:
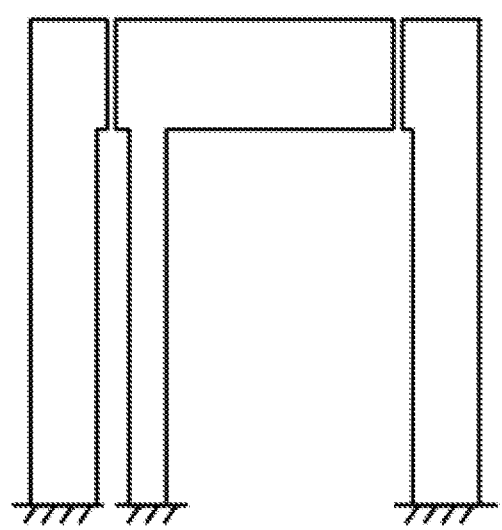
Figure 5E:
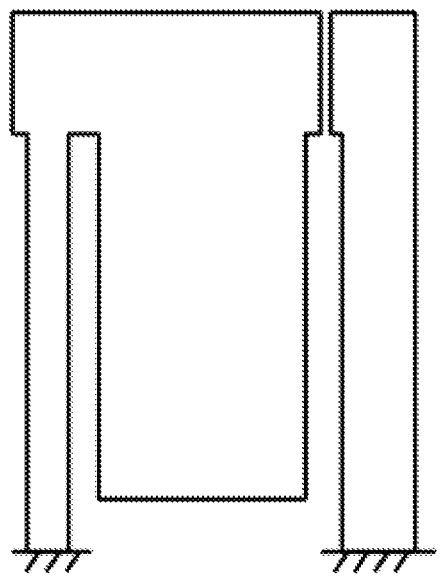
Figure 5F:
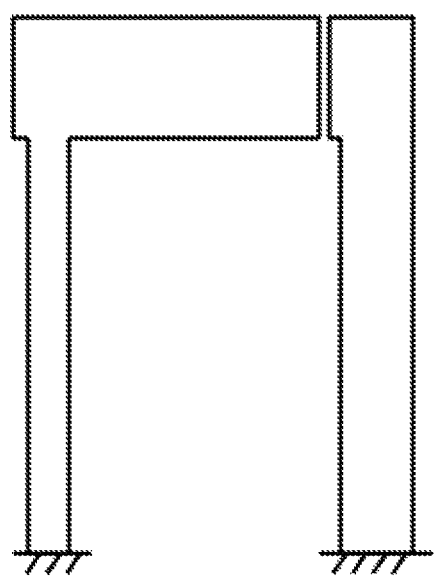
Figure 5G:
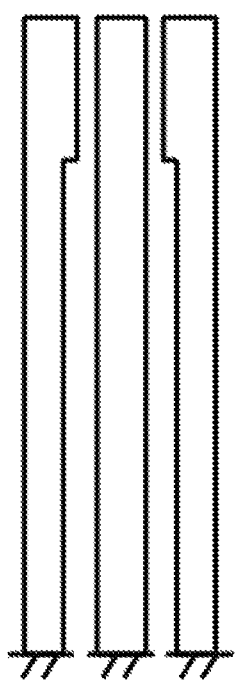
Figure 5H:
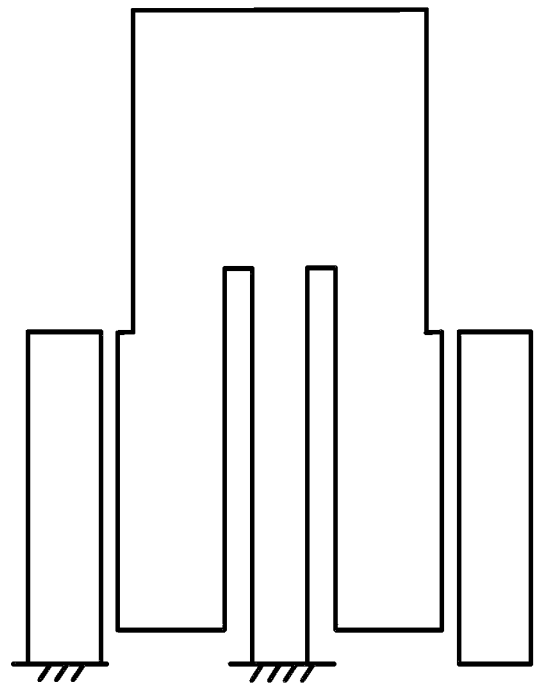
Figure 6:
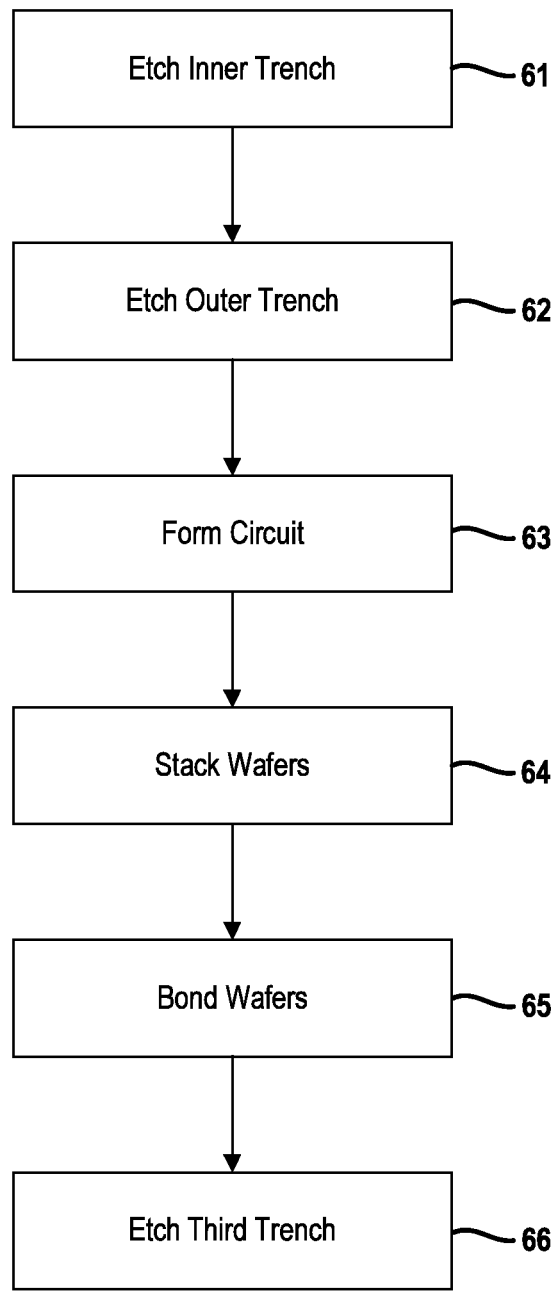
FIG. 6 is a flowchart depicting a method for fabricating a transducer having a high aspect ratio.

FIGS. 5A-5H illustrate different example configurations for the proof-mass 12. In FIGS. 5A and 5B, the mass 12 is symmetric about the beam 13; whereas, in FIGS. 5C-5F, the mass 12 is asymmetric about the beam 13. In FIG. 5A, it is noted that the mass 12 is disposed above the beam 13 and does not extend downward along the vertical surface of the beam 13. In FIG. 5G, the beam 13 serves as the mass. That is, no additional mass is coupled to the beam. While the mass is integrally formed with the beam from the same wafer in these configurations, it is also envisioned that the mass can be a separate piece that is bonded or otherwise coupled to the beam. It is understood that these different configurations are illustrative and this disclosure is not limited thereto.

Due to limitations associated with deep reactive ion etching, gap dimension of less than 3 μm is only achievable for heights ranging from 10 s to 100 μm. Not only the gap height is limited, the device thickness is also limited to the same range. Electrostatic devices also require various gap dimensions for reducing the parasitics to avoid coupling and provide good isolation. With one DRIE step, when large gaps are exposed first, the materials already patterned on the glass substrates will be sputtered or etched. Thus, conventional processes are not applicable for fabricating the proposed transducer.

A method for fabricating a transducer with higher aspect ratios is described in relation to FIG. 6 and FIGS. 7A-7F. A first substrate serves as the start point for fabricating the sensing/actuation structure of the transducer. In an example embodiment, the first substrate is a polished silicon wafer having a height on the order of one thousand micrometers. In preparation, oxide layers may be deposited onto both sides of the silicon wafer as seen in FIG. 7A.

Referring to the FIG. 7B, an inner trench and an outer trench are formed 61, 62 into one (bottom) surface of the first substrate. The inner trench defines a cantilever beam for the sensing/actuation structure; whereas, the outer trench defines the mass surrounding the cantilever beam. In the example embodiment, the inner trench and the outer trench are etched concurrently using deep reactive ion etching. It is envisioned that the trenches may be formed independently. Other techniques for forming the trenches are also contemplated by this disclosure.

A second substrate serves as the base for the transducer. A circuit is formed at 63 on the top surface of the second substrate as seen in FIGS. 7C and 7D. In the example embodiment, the circuit is comprised of the bonding pads and the electrical interconnections for the sensing/actuation structure. It is readily understood that different circuit arrangements may be formed depending of the type of MEMS device.

In FIG. 7E, the first substrate is then stacked and bonded 64, 65 to the second substrate. In particular, the (bottom) surface in which the inner and outer trenches were formed is faced towards and disposed directly onto the top surface of the second substrate. In this way, the cantilever beam extends upwardly from the top surface with the overhangs of the proof-mass extending downward from the top of the cantilever beam. A slot separates the additional sections of the proof-mass from the vertical surfaces of the cantilever beam.

Lastly, a third trench is formed at 66 into the top surface of the first substrate as seen in FIG. 7F. The third trench aligns with the second trench and is formed to a depth such that the third trench interconnects with the second trench to form a channel surrounding the sensing/actuation structure, thereby releasing the structure. In the example embodiment, the third trench is etched using deep reactive ion etching although other methods are contemplated as well.

For a better understanding, a particular fabrication method is further described as follows. Starting with a highly doped silicon wafer, a shallow recess (e.g., 6 μm) is patterned and etched into one surface of this first substrate. Cantilever and electrodes anchors are not etched. Oxide layers (e.g., 4 μm) are then deposited on both sides of a highly doped silicon wafer. A patterned photoresist layer on the bottom side is used as a mask for RIE of the oxide. This mask defines the vertical springs, masses, electrodes and the larger capacitive sensing/actuation gaps $g_{bot}$. The backside oxide layer defines the smaller capacitive sensing/actuation gaps $g_{top}$ during the final DRIE release step. The alignment between the small and large gaps is critical in this step. In this embodiment, the small gaps are located at the top part of the proof mass, which contribute the most to the sensitivity. Larger openings are also patterned to physically separate and electrically isolate the individual mass, electrodes and neighboring sensors.

Inner and outer trenches with different depths are formed by deep reactive ion etching, using different trench opening sizes and taking advantage of the DRIE lag. Following that, the oxide on the front side is removed and a blanket stack (e.g., Cr/Au 200 Å/3000 Å) is evaporated on the front side to serve as Si—Au eutectic bonding inter-layer and prevent the silicon surface from being oxidized prior to bonding.

For the device base, a lightly doped wafer is covered with a layer of LCPVD oxide (e.g., 4 μm). The oxide is patterned using photoresist. This oxide is used as a passivation layer. Recesses (e.g., 3 μm) are formed on the oxide to further suspend the proof mass and separate individual sensor. To form a detection circuit, in-situ doped polysilicon (e.g., 0.6 μm using LPCVD) is deposited and patterned for electrical interconnections. Additionally, oxide passivation (e.g., 1 μm using PECVD) is patterned to protect the polysilicon interconnects from the subsequent DRIE release step. A metal layer (e.g., 1 μm of Au) is deposited and lifted off to define the eutectic bond pads and connections.

Next, the two wafers are aligned and brought in contact before being placed in a bonder (e.g., SUSS SB6e bonder). In this example, Si—Au eutectic bonding is used to anchor the vertical springs and sidewall electrodes to the base substrate although other types of bonding techniques may be used as well.

Finally, the small gaps $g_{top}$ are formed from the top by DRIE. Dry etch of the remaining oxide mask is followed by blanket deposition of metal for contact and electrical testing. This method results in small effective sensing gaps where needed and achieves device thickness beyond the typical 500 μm. While the above fabrication method has been described with specific components having specific values and arranged in a specific configuration, it will be appreciated that this method may be implemented with many different configurations, components, and/or values as necessary or desired for a particular application. The above configurations, components and values are presented only to describe one particular embodiment that has proven effective and should be viewed as illustrating, rather than limiting, the present disclosure.

Figure 8:
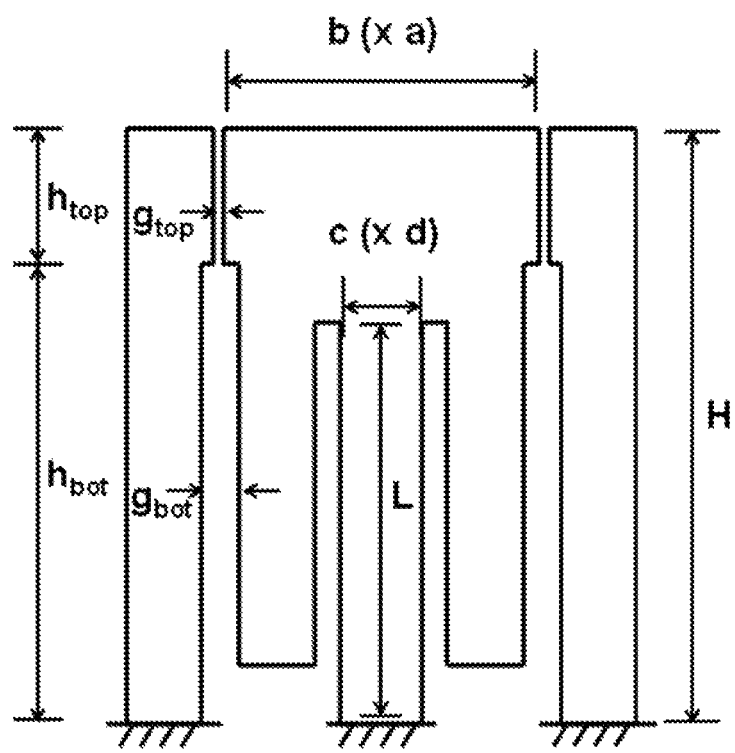
FIG. 8 is a cross-sectional view of an example transducer structure having a channel with different width sections.

FIG. 8 shows the critical dimensions of the 2-gap structure for the proposed transducer. All the lateral gap dimensions are independently defined from both sides of a single wafer to form the spring height (L), top gap height ($h_{top}$), top sensing gap ($g_{top}$), bottom gap height ($h_{bot}$), bottom sensing gap ($g_{bot}$); either of the two sensing gaps $g_{top}$ and $g_{bot}$ can be made ultra-high aspect ratio to optimize for sensitivity and electrical tunability.

In some embodiments, the transducer structure has a height on the order of 100 micrometers (e.g., 100-150 micrometers). In such embodiments, the aspect ratio of the height of the transducer structure to the narrow section of the gap is greater than 100 and preferably greater than 200. For example, for a transducer structure with a height of 100 micrometers, the narrow section of the gap may be formed in the range of 0.2-1 micrometers (and preferably less than 1 micrometer). Thus, a transducer structure with a height of 100 micrometers with a gap width of 0.5 micrometers has an aspect ratio of 200. Similar values may apply to transducer structures with a uniform gap width as well. It is readily understood that the narrow section of the gap may be near the top of the structure, near the bottom of the structure or a combination thereof.

In other embodiments, the transducer structure has a height greater than 500 micrometers (e.g., in the range of 500-2000 micrometers). In such embodiments, the aspect ratio of the height of the transducer structure to the narrow section of the gaps greater than 250 and preferably greater than 300. For example, the transducer structure may have a height on the order of 500 micrometers with the narrow section of the gap in the range of 2 to 5 micrometers and preferably around 2-3 micrometers. In another example, the transducer structure may have a height on the order of 1000 micrometers with the narrow section of the gap in the order of 3 micrometers. These examples are merely illustrative of the combinations of heights and widths that may yield transducers with high aspect ratios.

Figure 9A:
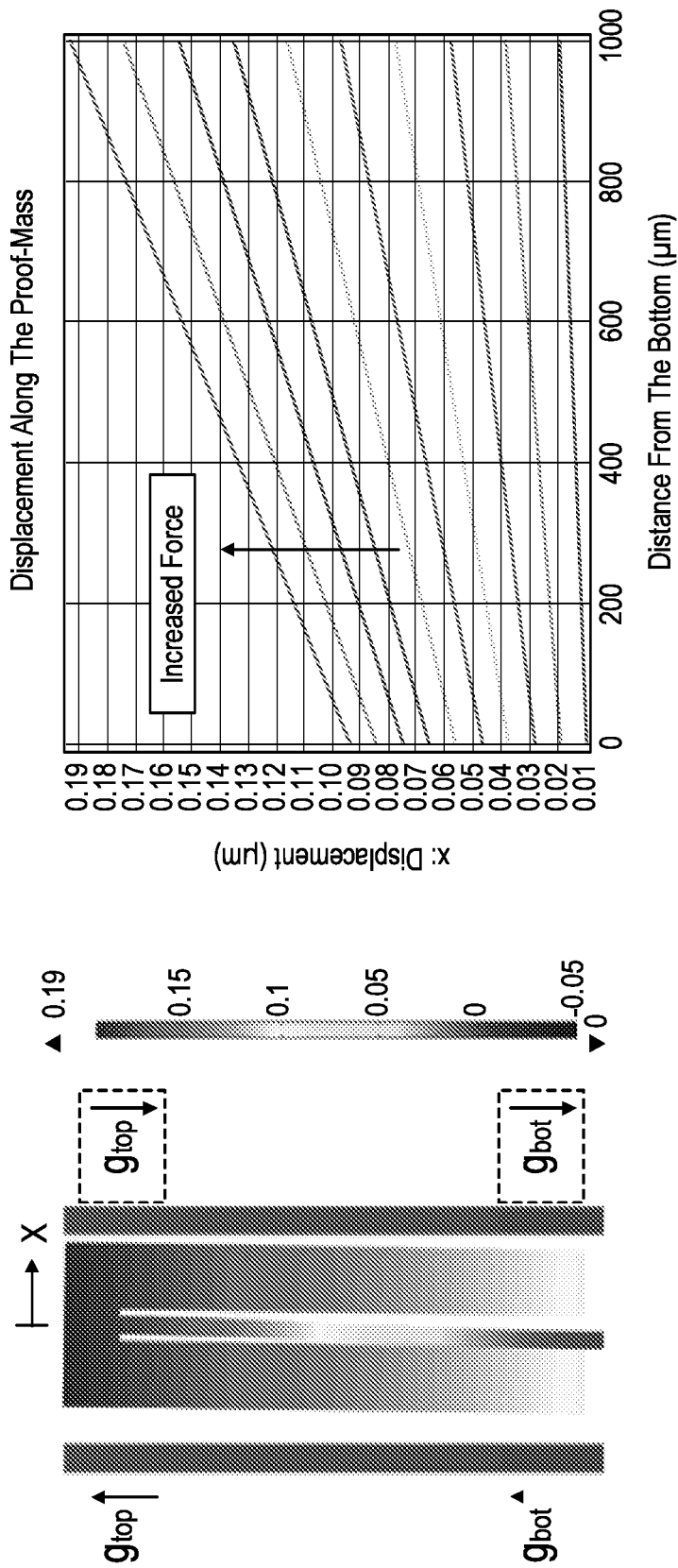

The proof-mass undergoes deflection when force is exerted. Therefore, to achieve high sensitivity, one needs to reduce the effective sensing gaps along the height. As shown in FIGS. 9A and 9B, the spring length L, material properties and mass center determine the displacement along the side of the proof-mass. For the design in FIG. 9A), both $g_{top}$ and $g_{bot}$ decreases in same direction force is applied. In FIG. 9B, $g_{top}$ decreases and $g_{bot}$ on the opposite side decreases because at roughly 200 μm from the bottom, there exists a neutral point where sensing gap does not change.

In FIG. 8, $g_{top}$ is the more effective gap. Optimization of the 2-gap profile ($g_{top}$ and $g_{bot}$) is demonstrated by COMSOL simulation results shown in FIG. 10. The top of a vertical inverted pendulum undergoes the maximum deflection in the same direction of force exerted on the proof mass. The simulation of various gap profiles verified that the capacitive sensing/actuation gap near the top of a vertical capacitive transducer ($g_{top}$) contributes a larger fraction of the total change in capacitance, $\Delta C_{total}$. As shown in FIG. 10, for a uniform gap ($g_{top}$=$g_{bot}$=2 μm), the top 30% ($h_{top}/H$=0.3) of the gap contributes >50% of $\Delta C_{total}$ (black). For $g_{top}$=2 μm, $g_{bot}$=20 μm and $h_{top}/H$=0.3, $\Delta C_{top}/\Delta C_{total}$ is >90% (red) and $\Delta C_{total}$ is >50% of a 2 μm uniform narrow gap profile. Therefore, to achieve high sensitivity, one does not need to etch a narrow gap through the entire device height. A narrow gap near the top of a tall device is sufficient to improve sensitivity. The device height (H) is not limited by DRIE etch and can be greatly increased by allowing a wider $g_{bot}$. The UHAR DRIE is ideal for achieving>100:1 aspect-ratio for $g_{top}$=2 μm.

FIGS. 11A and 11B depict different arrangements for the sensing/actuation gaps. In FIG. 11A, top sensing gap is larger than the bottom sensing/actuation gaps. Large deflection is experienced at $g_{bot}$ when there exists a neutral horizontal axis crossing the height where the displacement of the mass with respect to the electrode is zero. When the proof-mass and spring length is designed such that $g_{bot}$ increases in the same direction of inertial force but $g_{bot}$ in the opposite direction of inertial force exerted decreases, $g_{bot}$ is an effective sensing/actuation gap.

Figure 12:
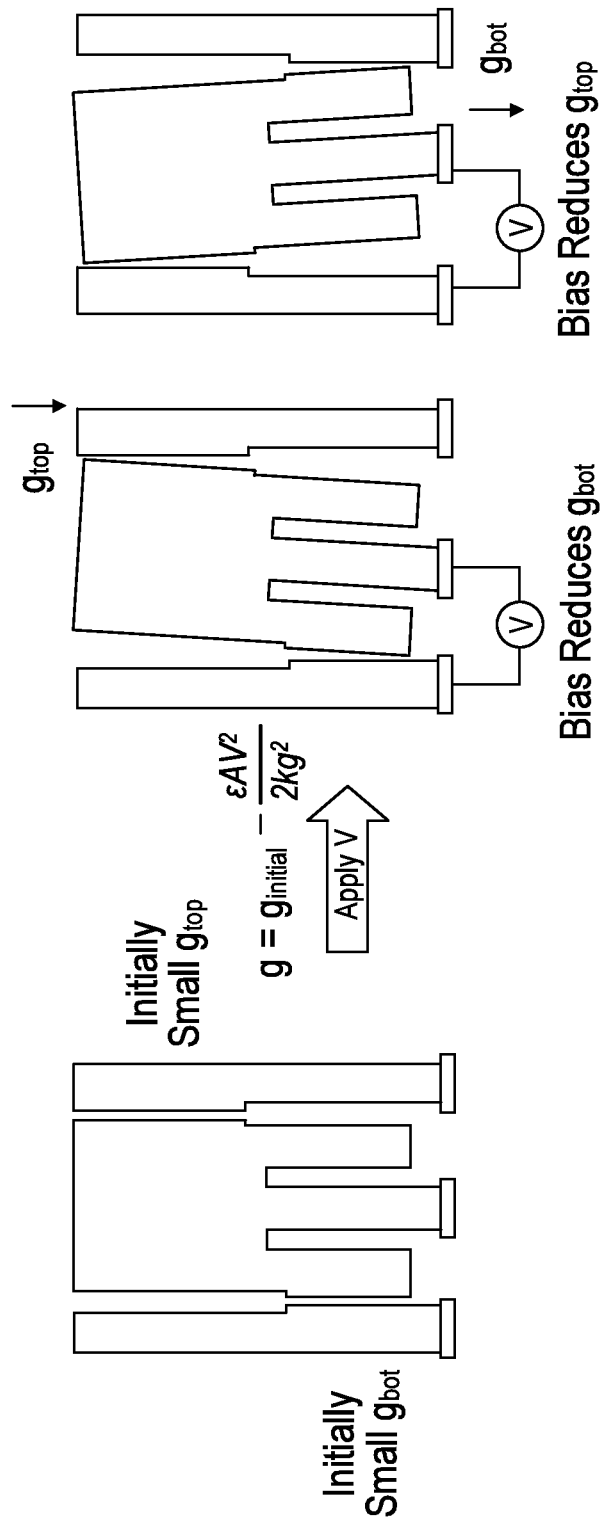
FIG. 12 is a diagram depicting how a bias can be applied to reconfigure the gap size of the transducer structure.

In FIG. 11B, the top sensing gap is larger than the bottom sensing/actuation gap on some sides of the transducer structure while the top sensing/actuation gap is smaller than the bottom sensing/actuation gap on other sides of the sensing/actuation structure. Both minimum $g_{top}$ and $g_{bot}$ are achieved for the same thick structure forming multiple electrodes. Sensing and actuation can be implemented on both sides or opposite sides. Furthermore, reconfigurable gaps can be formed by applying DC bias and bring the proof-mass even closer to the sensing electrodes prior to operation as seen in FIG. 12. Reducing the initial gap will help reduce the actuating voltage between the actuation electrode and proof-mass. Such reconfigurable gaps have been demonstrated for surface micromachined accelerometer but it requires doubling the area of the original comb fingers to reduce the initial sensing gap from 1.5 μm to 0.5 μm by applying 2V DC bias.

Figure 13:
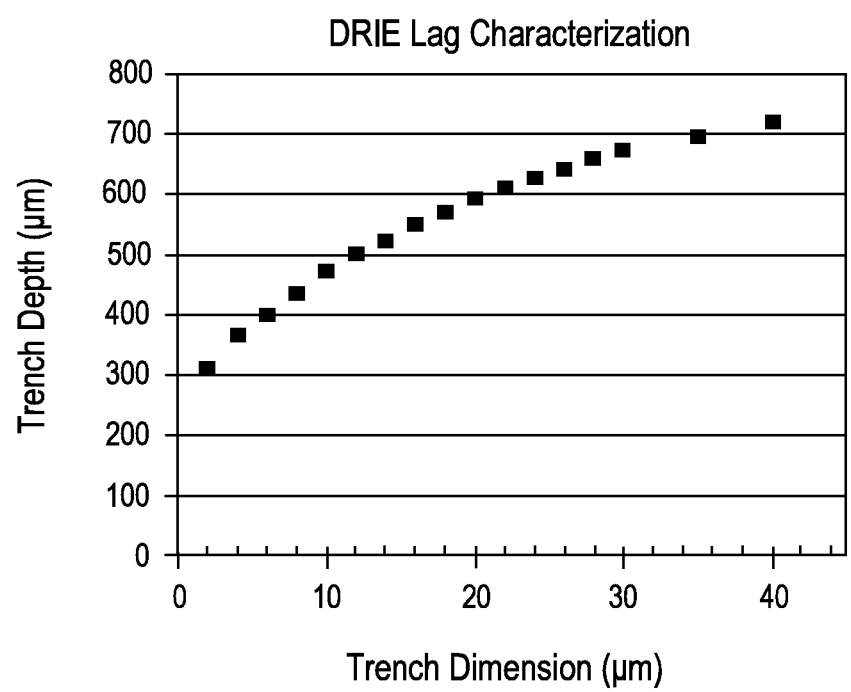
FIG. 13 is a graph showing the lag characterization for the two-gap fabrication method.

In one aspect, an improved DRIE process can be used to etch high aspect-ratio sensing actuation gaps by reducing undercut and making straight sidewalls. This is achieved by ramping process pressure, etch power, and switching time. The aspect-ratio dependent etching in deep silicon etching processes causes bigger features to be etched at faster rates is known as DRIE lag. In this disclosure, DRIE lag is well tuned to get the desired gap dimensions, spring height and etc. FIG. 13 shows the characterization data for DRIE lag with different gaps for making 1000 μm thick device. DRIE from both sides is tested on the same 1000 μm thick wafer. 2 μm (on the original mask) opening reaches a depth of 300 μm and 40 μm opening reaches a depth of 720 μm. 2.5 μm initial sensing gap from either side is etched to reach a depth of 250-300 μm, achieving aspect-ratio>120:1. The total device thickness is not compromised and can take any wafer thickness, thereby enabling a large proof-mass. Thus, two DRIE steps are sufficient to define the various gaps from both sides.

Figure 14C:
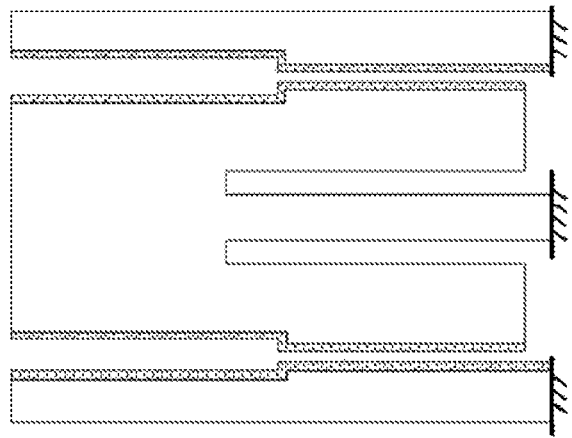
FIGS. 14A-14C are diagrams depicting how conformal deposition of polysilicon can further reduce the gap size of one or more the top and bottom gaps.
Figure 14B:
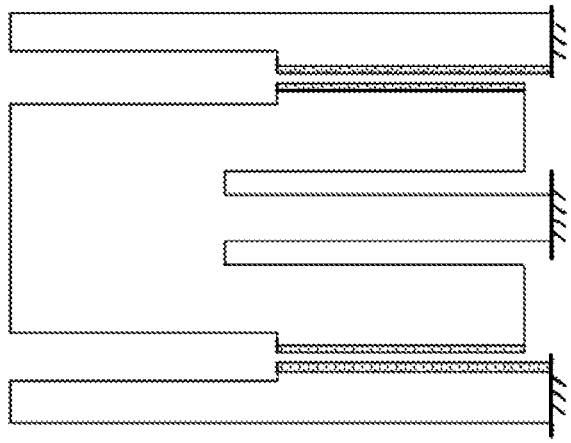
Figure 14A:
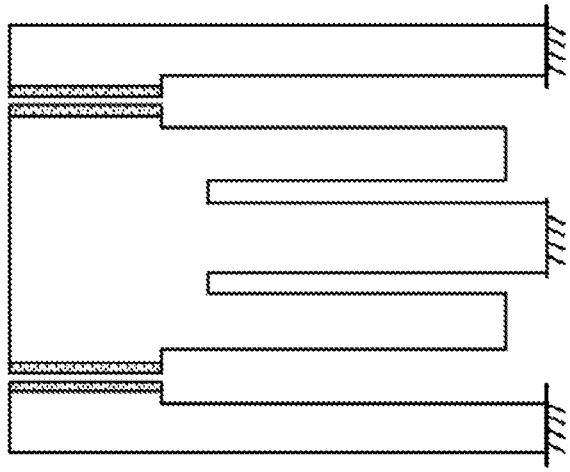
Figure 15:
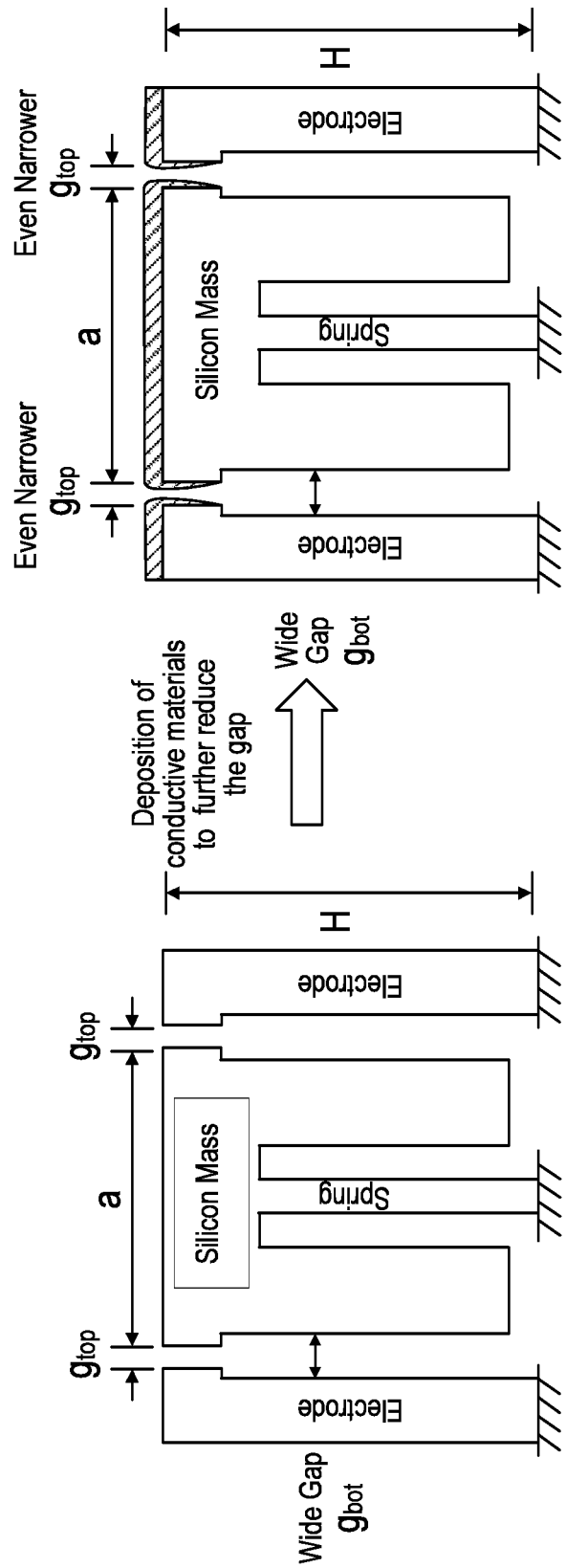
FIG. 15 is a diagram depicting how conformal deposition of a conductive material can further reduce the gap size.

In another aspect of this disclosure, advanced lithography techniques can be used to further reduce gaps, for example to less than 2 μm to allow for even smaller initial sensing gap. In one example, the top gaps can be further reduced (e.g., to 1-1.5 micrometers) by conformal deposition of in-situ doped polysilicon or other conductive materials as seen in FIGS. 14A-14C. In another example, the top gaps can be further reduced by conformal deposition of metals or other conductive materials as seen in FIG. 15. Other techniques for reducing gaps size are also contemplated by this disclosure.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for fabricating a capacitive-based transducer with a high aspect ratio, comprising:
    forming an inner trench into a bottom surface of a first substrate, whereby the inner trench defines and surrounds a cantilever beam for a transducer structure;
    forming an outer trench into the bottom surface of the first substrate, wherein the outer trench surrounds the inner trench;
    mounting the first substrate onto the top surface of a second substrate, such that the bottom surface of the first substrate is supported by the top surface of the second substrate;
    bonding the first substrate to the second substrate to form a transducer structure; and
    forming a third trench into a top surface of the first substrate, such that the third trench aligns with the second trench and the third trench has a depth that interconnects the third trench with the second trench to form a channel surrounding the transducer structure, whereby sidewalls of the channel serve as capacitive plates.

2. The method of claim 1 further comprises etching the third trench with a smaller width than the second trench.

3. The method of claim 1 further comprises etching the third trench with a larger width than the second trench.

4. The method of claim 1 further comprises etching the first trench and the second trench concurrently using deep reactive ion etching.

5. The method of claim 4 further comprises forming a metal layer on the bottom surface of the first substrate to serve as a bonding inter-layer and prevent oxidization prior to the step of bonding.

6. The method of claim 1 further comprises forming a detection circuit on the top surface of the second substrate prior to mounting the first substrate to the top surface of the second substrate, wherein forming a detection circuit includes depositing an oxide layer onto the second substrate, forming recesses into the oxide layer, and depositing metal onto the oxide layer to form bonding pads and electrical interconnections.

7. The method of claim 1 further comprises depositing a metal onto the top surface of the first substrate after the step of etching the third trench.

8. The method of claim 1 wherein etching the third trench by deep reactive ion etching.

9. The method of claim 1 wherein depth of the channel surrounding the transducer structure is on the order of 1000 micrometers with narrowest width of the channel on the order of 3 micrometers and an aspect ratio of depth of the channel surrounding the transducer structure to narrowest width of the channel surrounding the transducer structure is greater than three hundred.

10. The method of claim 1 wherein depth of the channel surrounding the transducer structure is on the order of 100 micrometers with narrowest width of the channel less than one micrometer and an aspect ratio of depth of the channel surrounding the transducer structure to narrowest width of the third trench is greater than one hundred.

* * * * *